United States Patent [19]

Deaver

[11] Patent Number: 4,991,916

[45] Date of Patent: Feb. 12, 1991

[54] METHOD AND APPARATUS FOR AUTOMATICALLY BIASING A PUSH-PULL AMPLIFIER

[75] Inventor: David K. Deaver, Snohomish, Wash.

[73] Assignee: John Fluke Mfg. Co., Inc., Everett, Wash.

[21] Appl. No.: 180,540

[22] Filed: Apr. 12, 1988

[51] Int. Cl.[5] .............................................. H03F 2/26
[52] U.S. Cl. ...................................... 330/263; 330/267
[58] Field of Search ............... 330/262, 263, 265, 267, 330/270, 273, 208

[56] References Cited

U.S. PATENT DOCUMENTS 3,536,958 10/1970 Sondermeyer ................. 330/263 X
4,077,013 2/1978 Morez et al. ......................... 330/267
4,121,168 10/1978 Stitt ................................. 330/268 X

OTHER PUBLICATIONS 6.62 A Simple Direct-Coupled Power MOSFET, Audio Amplifier Topology Featuring Bias Stabilization-1982 IEEE, Reprinted.
6.6 Audio Amplifiers, 6.6.1 The Autobias Amplifier: A New (AC Coupled) Topology for Automatically Biased Audio Amplifiers using Power MOSFETs (TA8-2-1).

Primary Examiner—Steven Mottola
Attorney, Agent, or Firm—Seed and Berry

[57] ABSTRACT

Method and apparatus are disclosed for automatically biasing a push-pull amplifier. Generally, the auto-biasing circuit of the present invention includes a resistor circuit for sensing the supply current to the push-pull amplifier. A control circuit responds to a minimum value of the supply current to increase charge which is stored in a charge storage circuit. A source circuit responds to the increase in stored charge of the charge storage circuit to increase a control current and, consequently, increase the supply or bias current of the push-pull amplifier. In an alternative embodiment a dynamic control circuit is used to continually modulate the supply current so that the difference between the average supply current and the average output current is maintained at a predetermined value.

24 Claims, 2 Drawing Sheets 4,991,916

1

METHOD AND APPARATUS FOR AUTOMATICALLY BIASING A PUSH-PULL AMPLIFIER

TECHNICAL FIELD

The present invention is directed toward push-pull amplifiers and, more particularly, toward method and apparatus for automatically biasing a push-pull amplifier.

BACKGROUND OF THE INVENTION

Push-pull amplifiers have been used in the art for a number of years Generally, a first "push" transistor provides positive output current in response to a positive input signal and a second "pull" transistor provides negative output current in response to a negative input signal. Due to switching characteristics of the output transistors, it is commonly desirable to bias the output transistors such that the effect of any threshold voltages which are necessary before conduction can be minimized or, preferably eliminated.

Prior art biasing techniques fall generally in one of two categories. The first category includes those circuits which provide a constant bias current regardless of operational conditions. The second category includes those circuits whose bias current is dependent upon a voltage source which may or may not be thermally linked to the output transistors. Both categories of biasing circuits suffer from the disadvantage that their performance is degraded by operational and physical characteristics of the circuit components Particularly, the bias current which is established by these circuits is not stable with varying temperature. The temperature characteristics of these circuits, as well as other undesired operational characteristics, result in increased power dissipation and/or increased distortion in the output signal.

It is desirable, therefore, to have a biasing circuit for use with a push-pull amplifier which establishes the bias current substantially independent of variations in temperature and other operating conditions. It is further desirable to provide a biasing circuit which minimizes power dissipation while minimizing any penalties in distortion of the output signal.

DISCLOSURE OF THE INVENTION

The present invention comprises a circuit for automatically biasing a push-pull amplifier. The auto-biasing circuit of the present invention includes a feedback circuit for sensing the current supplied to the load. A charge storage circuit, which generally comprises a resistor and capacitor coupled in parallel, is provided for storing charge. A control circuit is responsive to the sensed load current for selectively charging and discharging the charge storage circuit A control current source is coupled to the charge storage circuit for providing a control current which is proportional to the charge stored by the charge storage circuit. A biasing circuit is coupled to receive the control current and to bias the push-pull amplifier transistors into their conducting range.

In a first alternative embodiment, the control circuit comprises a transistor having its collector terminal coupled to a current conducting element and a diode coupled to supply current from the charge storage circuit to the collector terminal of the transistor. The control terminal of the transistor is coupled to the feedback circuit such that when the load current falls below a predetermined minimum value, the transistor is turned off causing the charge storage circuit to store charge and, consequently, causing the control current to be increased.

In a second alternative embodiment, the control circuit comprises an averaging circuit for providing a voltage which is proportional to the difference between the average supply current and the average output current The control circuit also includes a reference circuit for providing an offset voltage of a predetermined magnitude The control circuit of the second embodiment is constructed to charge tee charging circuit and, consequently, increase the control current, when the difference between the average supply current and average output current is below a minimum value as determined by the offset voltage.

BEST MODE FOR CARRYING OUT THE INVENTION

Figure 1:
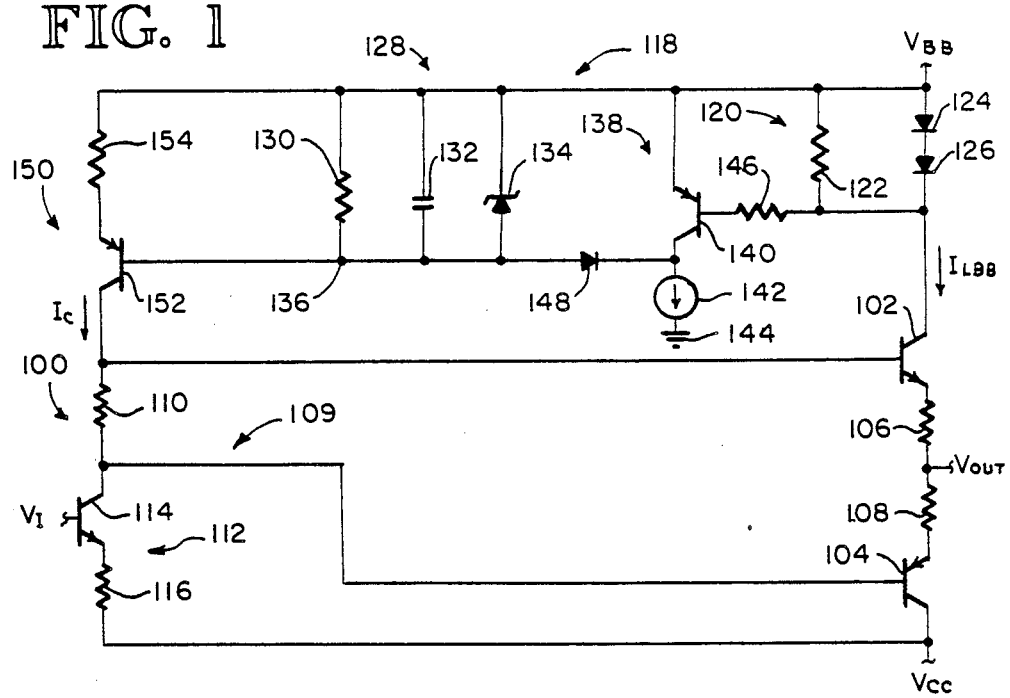
FIG. 1 is a schematic circuit diagram of an auto-biasing push-pull amplifier including the novel auto-biasing circuit which is the subject of the present invention.

The improved auto-biasing push-pull amplifier circuit 100 which is the subject of the present invention is illustrated in FIG. 1. The circuit includes first and second output transistors 102 and 104, respectively, each having their collector terminals coupled to a respective supply voltages $V_{BB}$ and $V_{CC}$. It will be appreciated by those skilled in the art that although the present invention is illustrated and described by reference to bipolar transistors having emitter, collector and control terminals, the invention may be implemented using a variety of transistor-type devices such as metal oxide silicon field effect transistors (MOSFETs), junction field effect transistors (JFETs), etc. Further, those skilled in the art will appreciate that in many applications various circuits could be used to implement the functions represented by single transistors herein, including multiple transistor circuits.

The push-pull amplifier 100 also includes first and second output resistors 106 and 108, respectively, for providing a predetermined voltage differential between the emitter terminals of the first and second output transistors 102 and 104, as is known in the art. The output transistors 102 and 104 are coupled to respective supply voltages $V_{BB}$ and $V_{CC}$ for receiving respective positive and negative load currents $I_{LBB}$ and $I_{LCC}$.

The push-pull amplifier 100 further includes a biasing circuit 109 which comprises a biasing resistor 110 serially coupled to a current conducting element 112. As shown in FIG. 1, the current conducting element 112 comprises a transistor 114 serially coupled to a resistor 116. The current conducting element 112 is provided for conducting a current which is proportional to the voltage input $V_I$ to the amplifier, as is known in the art.

The amplifier 100 further includes an auto-biasing circuit 118 which is provided for maintaining the positive load current $I_{LBB}$ above a predetermined minimum value, the minimum value being referred to herein as the bias current $I_{BIAS}$. The auto-biasing circuit 118 includes a resistor circuit 120 which comprises an input resistor 122 coupled in parallel with first and second input diodes 124 and 126, respectively. The resistor circuit 120 is coupled intermediate the supply voltage $V_{BB}$ and the collector terminal of the first output transistor 102. In this configuration, a voltage will be developed across the resistor 122, which voltage will be substantially proportional to the load current $I_{LBB}$. The input diodes 124 and 126 provide a conduction path for large bias currents which are to be provided to the transistors 102 and 104 from the supply voltage $V_{BB}$.

A charge storage circuit 128 comprises a resistor 130, a capacitor 132 and a Zener diode 134 coupled in parallel. The charge storage circuit 128 is coupled intermediate the supply voltage $V_{BB}$ and a primary control node 136. The charge storage circuit 128 is provided for storing charge which controls the modulation of the bias current, as will be described more fully below. The auto-biasing circuit 118 also includes a control circuit 138 which is provided for selectively drawing current from the primary control node 136 when the load current sensed by the input resistor 122 falls below the predetermined minimum value $I_{BIAS}$. It is to be noted that by drawing current from the primary control node 136, additional charge is stored in the charge storage circuit 128.

The control circuit 138 comprises a switching transistor 140 having its collector terminal coupled to a current conducting element 142. The current conducting element 142 is coupled intermediate the collector terminal of the switching transistor 140 and a reference node 144. The current conducting element may comprise a resistor or, alternatively, may comprise a resistor-transistor circuit constructed to continuously conduct current.

A current limiting resistor 146 is coupled intermediate the collector terminal of the first output transistor 102 and the control terminal of the switching transistor 140. The emitter terminal of the switching transistor 140 is coupled to the supply voltage $V_{BB}$. A diode 148 is coupled to conduct current from the primary control node 136 to the collector terminal of the switching transistor 140.

When the voltage developed across the input resistor 122 (which voltage is substantially proportional to the load current $I_{LBB}$) is below the emitter-to-base threshold voltage of the switching transistor 140, the switching transistor will be off, i.e., will not conduct current and, accordingly, the potential of the collector terminal of the switching transistor 140 will decrease below the threshold voltage of the diode 148 causing current to be conducted from the primary control node 136 to the current conducting element 142. The charge storage circuit 128 will begin to increase its stored charge thus increasing the potential difference between the supply voltage $V_{BB}$ and the primary control node 136. Conversely, when the voltage across the input resistor 122 is greater than the emitter-to-base threshold voltage of the switching transistor 140, the switching transistor 140 will conduct current thus increasing the potential of the collector terminal to substantially $V_{BB}$ and back biasing the diode 148 such that charge stored in the charge storage circuit 128 remains substantially constant.

The auto-biasing circuit 118 also includes a current source circuit 150 which is responsive to the charge stored in the charge storage circuit 128 to provide a control current $I_C$. The current source circuit 150 includes a source transistor 152 having its control terminal coupled to the primary control node 136 and its collector terminal coupled to the biasing circuit 109. A source resistor 154 is coupled intermediate the emitter terminal of the source transistor 152 and the supply voltage $V_{BB}$.

When the voltage across the input resistor 122 falls below the predetermined minimum value $I_{BIAS}$, the switching transistor 140 does not conduct current thereby increasing the charge stored in the charge storage circuit 128 and, consequently, increasing the potential difference between the supply voltage $V_{BB}$ and the primary control node 136. The low potential of the control node 136, which corresponds to the control terminal of the source transistor 152, causes the current source circuit to conduct in the linear range such that decreases in the potential of the primary control node 136 result in increasing the control current $I_C$. Conversely when the voltage across the input resistor 122 is above the predetermined minimum value $I_{BIAS}$, then the switching transistor 140 conducts thereby substantially maintaining the stored charge in the charge storage circuit 128 and accordingly maintaining the control current $I_C$ at a substantially constant value.

It will be apparent to those skilled in the art that the resistor 130 of the charge storage circuit 128 provides a path for the capacitor to discharge at times when the load current is above the minimum bias current. This insures that unnecessarily high load currents will not be supplied to the output transistors 102 and 104 and thereby will insure that power dissipation is minimized.

As in known in the art, the voltage which is developed across the biasing resistor 110 as a result of the control current $I_C$ controls the first and second output transistors 102 and 104, via their control terminals, to conduct a corresponding current. The auto-biasing amplifier 100 therefore maintains a minimum bias current $I_{BIAS}$ by monitoring the load current and increasing the control current $I_C$ when the load current falls below a predetermined minimum value.

It will be appreciated by those skilled in the art that the predetermined minimum current $I_{BIAS}$ may be selected by proper choice of the current sensing resistor 122. Particularly, the minimum current $I_{BIAS}$ will be equal to the emitter-to-base threshold voltage $V_{TH}$ of the switching transistor 140 divided by the value R of the resistor 122, i.e.:

$$I_{BIAS} = (V_{TH}/R)$$

or $$R = (V_{TH}/I_{BIAS}).$$

It will further be appreciated that, in the presently preferred embodiment, the combined threshold voltage of the first and second input diodes 124 and 126 is greater than the threshold voltage of the switching transistor 140 to insure accuracy of the current sensing operation in the critical range.

The auto-biasing amplifier of FIG. 1, as constructed, will only maintain positive load current above a preselected minimum value However, an analogous arrangement can be implemented by sensing the negative load current $I_{LCC}$ intermediate the second output transistor 104 and the supply voltage $V_{CC}$. Further, an alternative auto-biasing amplifier 200 could be provided which includes a secondary auto-biasing circuit 201 in combination with the auto-biasing circuit 118 for monitoring both the positive and the negative bias currents to maintain each above respective predetermined minimum values.

Figure 2:
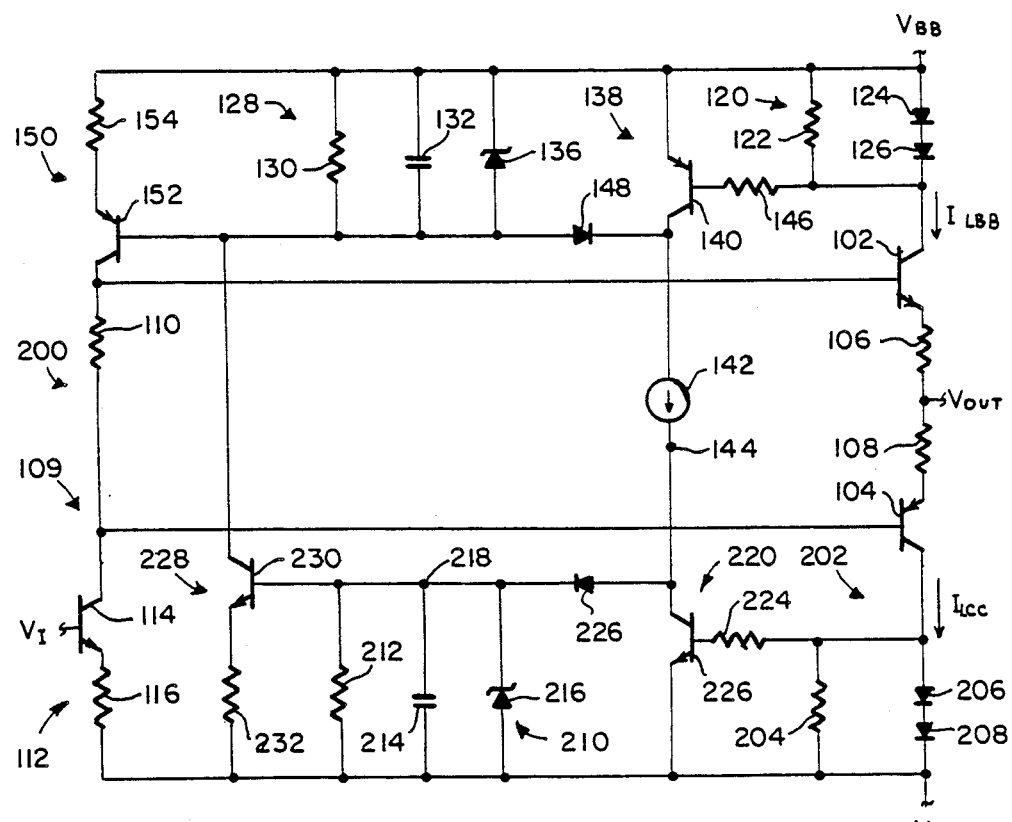
FIG. 2 is a schematic circuit diagram of an auto-biasing amplifier which automatically biases both the positive and negative supply currents.

The auto-biasing amplifier 200 is illustrated in FIG. 2, wherein like elements have been given like reference numbers. Therein a secondary resistor circuit 202 includes a secondary input resistor 204 coupled in parallel with first and second secondary input diodes 206 and 208, respectively. The secondary resistor circuit 202 is coupled intermediate the collector terminal of the second output transistor 104 and the supply voltage $V_{CC}$. Like the resistor circuit 120, the secondary resistor circuit 202 is provided for sensing the negative load current $I_{LCC}$.

The secondary auto-biasing circuit 201 has a secondary charge storage circuit 210 which comprises a resistor 212, a capacitor 214 and a Zener diode 216 coupled in parallel. The secondary charge storage circuit 210 is connected intermediate the supply voltage $V_{CC}$ and a secondary control node 218.

A secondary control circuit 220 includes a secondary switching transistor 222 having its emitter terminal coupled to the supply voltage $V_{CC}$ and having its collector terminal coupled to the reference node 144. A current limiting resistor 224 is coupled intermediate the control terminal of the secondary switching transistor 222 and the collector terminal of the second output transistor 104.

As constructed, the secondary switching transistor 222 will not conduct current when the voltage developed across the secondary input resistor 204 is less than the base-to-emitter threshold voltage of the secondary switching transistor 222. Hence, current supplied to the reference node 144 from the current conducting element 142 will be supplied to the secondary charge storage circuit 210 to increase the charge stored therein Conversely, when the voltage across the secondary input resistor 204 is greater than the base-to-emitter threshold voltage of the secondary switching transistor 222, then the secondary switching transistor will conduct current, back biasing the diode 226 such that charge stored in the secondary charge storage circuit 210 will remain substantially constant A secondary current source circuit 228 comprises a secondary source transistor 230 having its collector terminal coupled to the primary control node 136 and its control terminal coupled to the secondary control node 218. A secondary source resistor 232 is coupled intermediate the emitter terminal of the secondary source transistor 230 and the supply voltage $V_{CC}$.

In operation, when the current sensed by the secondary resistor circuit 202 falls below the predetermined minimum value (as determined by the value of the resistor 204), the secondary control circuit 220 couples the current conducting element 142 to the secondary charge storage circuit 210 such that the charge stored therein will be increased thereby increasing the potential difference between the secondary control node 218 and the negative supply voltage $V_{CC}$. In response to the increase in potential of the secondary control node 218, the secondary source transistor 230 conducts current from the primary control node 136 to increase the charge stored in the charge storage circuit 128. As previously, increasing the charge stored in the charge storage circuit, 128 increases the control current $I_C$ which is supplied by the current source circuit 150 to thereby increase the negative bias current.

Figure 3:
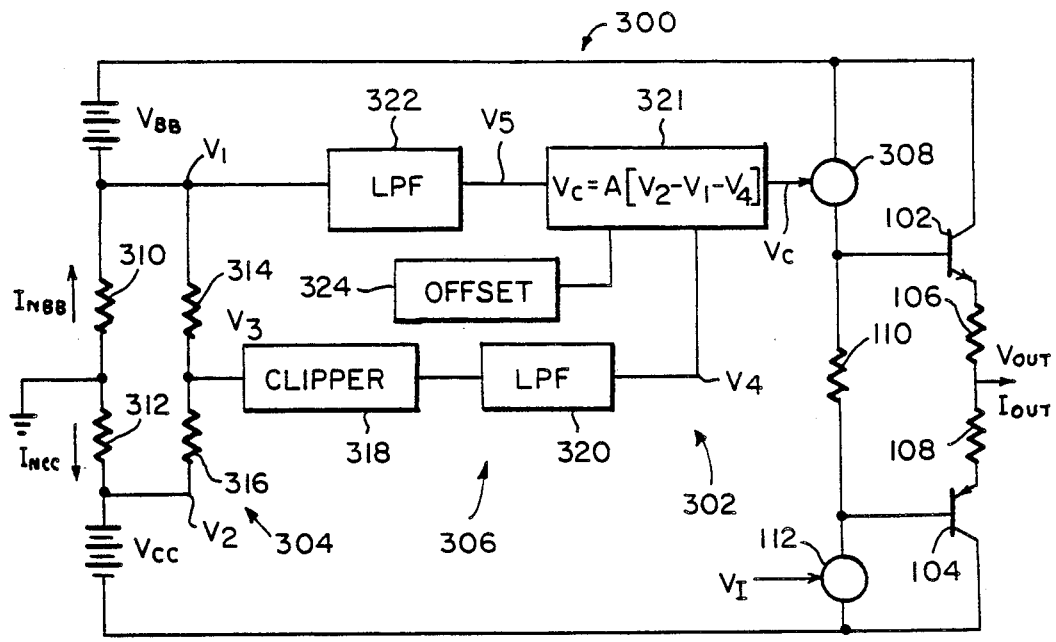
FIG. 3 is an illustrative block diagram of an auto-biasing amplifier which includes an alternative embodiment of the auto-biasing circuit.

The auto-biasing amplifier 200 operates to maintain the positive load current $I_{LBB}$ above a minimum level at times when the output current is negative and to maintain the negative load current $I_{LCC}$ above a minimum level at times when the output current is positive. Accordingly, as will be appreciated by those skilled in the art, the auto-biasing amplifier 200 provides only class A operation, i.e., operation wherein the load current is never zero. Although class A operation effectively minimizes distortion in the output signal, the designer who uses a class A circuit pays a power penalty Accordingly, it may be desirable to use an auto-biasing circuit with class A-B operation i.e., operation wherein the positive or negative load current is enabled to be zero. The auto-biasing amplifier 300, illustrated in FIG. 3, provides such operation.

The auto-biasing amplifier 300 includes an auto-biasing circuit 302 which comprises a resistor circuit 304 a control circuit 306 and circuit for supplying control current 308. The control current supply circuit 308 may comprise a charge storage circuit and a current supply circuit as described above by reference to FIGS. 1 and 2.

The resistor circuit 304 includes a positive sensing resistor 310 for sensing the current $I_{VBB}$ in the positive supply voltage $V_{BB}$ and a negative sensing resistor 312 for sensing the current $I_{VCC}$ in the negative supply voltage $V_{CC}$. It will be appreciated by those skilled in the art that although the supply voltages $V_{BB}$ and $V_{CC}$ are shown as batteries in FIG. 3, substantially any DC power supply could be used therefor. Further, it will be appreciated by those skilled in the art that although the supply currents $I_{VBB}$ and $I_{VCC}$ are not actually the load currents, and hence their sum is not exactly equal to the output current, other currents which are not supplied to the load are negligible and may be ignored. In any event, a circuit such as that shown in FIGS. 1 and 2 could be used in the embodiment of FIG. 3 to more accurately sense the load currents The resistors 310 and 312 actually develop a voltage drop which is proportional to the respective supply current and, in so doing, supply voltages $V_1$ and $V_2$, which voltages are proportional to their respective supply current, to resistors 314 and 316. The resistors 314 and 316 are provided for summing the sensed voltages $V_1$ and $V_2$, which sum $V_3$ is proportional to the output current $I_{OUT}$, and providing the sum voltage $V_3$ to a clipper 318.

The clipper 318 removes positive portions of the voltage $V_3$ (the positive portions of the voltage $V_3$ represent the value of the negative supply current) to provide only negative portions thereof to a low-pass filter 320. The low-pass filter 320 averages the voltage supplied by the clipper 318 and provides a voltage $V_4$ which is proportional to the average output current to a summing amplifier 321. The voltage $V_1$ is provided to a low-pass filter 322 which averages its value and provides a voltage $V_5$, which is proportional to the average value of the voltage $V_1$, to the summing amplifier 321. A voltage offset circuit 324 supplies an offset voltage $V_6$ to the summing amplifier 321. The summing amplifier 321 provides an output voltage $V_c$ which is proportional to the sum of its input voltages, i.e.:

$$V_c = A[V_5 - V_6 - V_4]$$

where A is an amplifier gain. The amplifier gain A may be typically chosen to be very large to minimize the value of $[V_5 - V_6 - V_4]$.

The auto-biasing circuit 302 of amplifier 300 is provided for maintaining the difference between the average positive supply current $I_{VBB}$ and the average output current $I_{OUT}$ above a predetermined minimum value The minimum value is supplied by the offset voltage source 324. The offset current supply circuit 308 is controlled by the control circuit 306 to maintain the difference between the average value of the positive supply current and the average value of the output current above the predetermined minimum value. Accordingly, during negative transitions of the output current, the positive supply current will be allowed to equal zero.

It will be apparent to those skilled in the art that the auto-biasing circuit 302 could be constructed to maintain the difference between the average value of the negative supply current and the average value of the negative output current above a predetermined minimum value. Further, an auto-biasing circuit could be implemented which maintains both the difference between the average positive supply current and the average positive value of the output current and the difference between the average negative supply current and the average negative value of the output current above respective predetermined minimum values.

Figure 4:
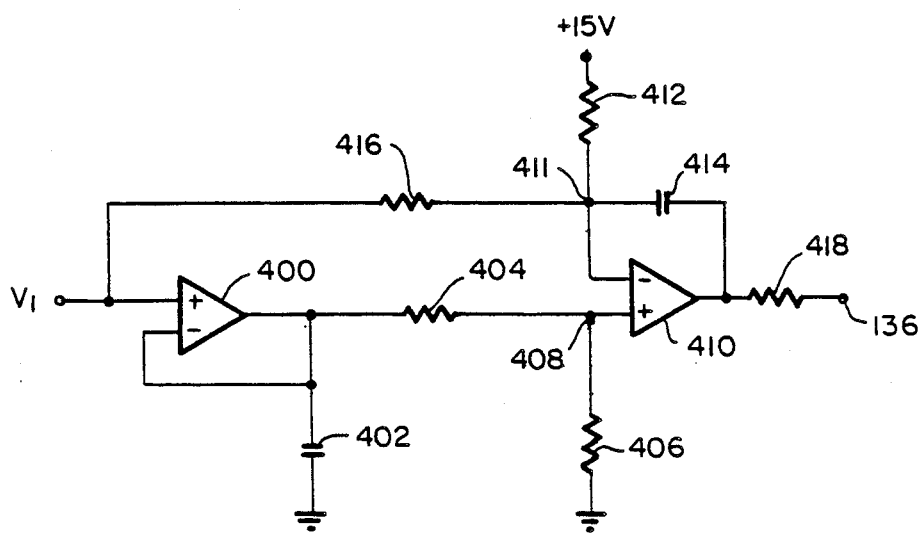
FIG. 4 is a schematic circuit diagram of still a third embodiment of the auto-biasing circuit which is the subject of the present invention.

An alternative embodiment for the control circuit 306 is illustrated in FIG. 4. The control circuit of FIG. 4 includes a peak detecting comparator 400 which has its positive input coupled to receive the voltage $V_1$, which voltage is proportional to the positive supply current. The output of the comparator 400 is coupled to its negative input and is also coupled to a reference potential via a capacitor 402. Additionally, resistors 404 and 406 are also coupled to the output terminal of the comparator 400 thus providing a voltage divider for the comparator output. In this configuration, the value of the comparator output will be established at the negative peak value of the output signal. The voltage divider established by resistor 404 and resistor 406 will provide a voltage to a node 408 which is proportional to the negative peak value of the output current. By proper choice of the resistors 404 and 406, e.g., resistor 404 equal to 21.4 kilohms and resistor 406 equal to 10 kilohms, the voltage supplied to the node 408 will be equal to the output voltage of comparator 400 divided by pi (approximately equal to 3.14). The comparator 400 may comprise any of various comparators readily available which provide open collector output characteristics or the equivalent.

The embodiment of FIG. 4 is particularly suited for applications wherein the output current is substantially sinusoidal such that its average positive current is equal to its peak positive current divided by the value of pi. The comparator 400 provides an output voltage which is proportional to the negative peak current of the output signal and the voltage divider established by resistors 404 and 406 provide a voltage to the node 408 which is proportional to the negative peak output current divided by pi.

The control circuit further includes a high gain amplifier 410 having its positive input coupled to the node 408. The negative input of the amplifier 410 is coupled to DC source voltage via a resistor 412 and a node 411. The combination of the DC source voltage and the resistor 412 provides a constant voltage to the negative input of the amplifier 410, which constant voltage is analogous to the voltage offset provided in the circuit of FIG. 3.

The negative input of the amplifier 410 i.e., the node 411 is further coupled to the output of the amplifier 410, via a capacitor 414. The voltage $V_1$ is supplied to the negative input of the amplifier 410 via a resistor 416. The amplifier 410, capacitor 414 and resistor 416 operate to average the voltage $V_1$, which average is representative of the positive supply current. The amplifier output may be coupled to the control current supply circuit 308 via a scaling resistor 418.

In operation when the voltage present at node 411 is greater than the voltage present at node 408, the output of the amplifier 410 will be a high negative value thereby reducing the potential of the offset current supply circuit control node and accordingly increasing the charge stored by the current supply circuit and consequently increasing the offset current which is supplied. Conversely, when the voltage present at the node 408 is greater than the voltage present at the node 411, the output of the amplifier 410 will be a high positive value thereby substantially maintaining the charge stored in the charge storage circuit and consequently, maintaining the offset current at a steady value. The net effect of using the control circuit of FIG. 4 will be to maintain the voltages present at the nodes 408 and 411 substantially equal. The currents which they represent will be adjusted accordingly such that the control circuit of FIG. 4 will seek to maintain the negative average value of the output current equal to the average value of the supply current minus the offset value. Or, put another way, the average supply current minus the average positive output current will equal the offset value.

It will be appreciated that, although specific embodiments of the invention have been described herein for purposes of illustration, various modifications may be made without departing from the spirit and scope of the invention. Accordingly, the invention is not limited except as by the appended claims.

I claim:

1. An improved push-pull amplifier of the type which includes first and second output transistors, each output transistor including first and second current conducting terminals and a respective output control terminal, the second current conducting terminal of the first output transistor being coupled to the first current conducting terminal of the second output transistor, a first voltage source, and a second voltage source coupled to the second conducting terminal of the second output transistor, said amplifier comprising:

resistor circuit sensing means for providing a voltage which is representative of the current supplied to the first output transistor by the first voltage source;

a charge storage circuit including a resistor and capacitor coupled in parallel, said charge storage circuit being coupled intermediate the first voltage source and a primary control node;

a control circuit including a switching transistor having first and second switching terminals and a switching control terminal, a first current conducting element coupled intermediate said second switching terminal and a reference node, and a diode coupled to conduct current from the primary control node to said second switching terminal, said switching control terminal being coupled to said resistor circuit sensing means and said first switching terminal being coupled to the first voltage source;

a current source circuit including a source resistor and a source transistor, said source transistor having first and second source terminals and a source control terminal, said source resistor being coupled intermediate the first voltage source and said first source terminal, said source control terminal being coupled to the primary control node; and a biasing circuit including a second current conducting element serially coupled to a bias resistor, the serial combination being coupled intermediate said second source terminal and the second voltage source, the first output control terminal being coupled to said second source terminal and the second output control terminal being coupled intermediate said bias resistor and said second current conducting element.

2. An amplifier as recited in claim 1 wherein said resistor circuit sensing means is coupled intermediate the first voltage source and the first current conducting terminal of the first output transistor.

3. An amplifier as recited in claim 2 wherein said resistor circuit sensing means comprises an input resistor coupled in parallel with at least one input diode.

4. An amplifier as recited in claim 3 wherein said at least one input diode is coupled intermediate the first voltage source and the first conducting terminal of the first output transistor so that positive current is conducted from the first voltage source to the first conducting terminal of the first output transistor.

5. An amplifier as recited in claim 3 wherein said at least one input diode is coupled intermediate the first voltage source and the first conducting terminal of the first output transistor so that positive current is conducted from the first conducting terminal of the first output transistor to the first voltage source.

6. An amplifier as recited in claim 1 wherein said first current conducting element comprises a resistor.

7. An amplifier as recited in claim 1 wherein said charge storage circuit further comprises a diode coupled in parallel with said capacitor.

8. An amplifier as recited in claim 1 further comprising:

secondary resistor circuit sensing means for providing a voltage which is representative of current supplied to the second output transistor by the second voltage source;

a secondary charge storage circuit including a resistor and a capacitor coupled in parallel, said secondary charge storage circuit being coupled intermediate the second voltage source and a secondary control node;

a secondary control circuit including a secondary switching transistor having first and second secondary switching terminals and a secondary switching control terminal, and a diode coupled to conduct current from the secondary control node to said first secondary switching terminal, said secondary switching control terminal being coupled to said secondary resistor circuit sensing means, said second secondary switching terminal being coupled to the second voltage source and said first secondary switching terminal being coupled to the reference node;

a secondary current source circuit including a secondary source resistor and a secondary source transistor, said secondary source transistor having first and second secondary source terminals and a secondary source control terminal, said secondary source resistor being coupled intermediate the second voltage source and said second secondary source terminal, said secondary source control terminal being coupled to the secondary control node and said first secondary source terminal being coupled to the primary control node.

9. An improved push-pull amplifier of the type which includes first and second output transistors, each output transistor including first and second current conducting terminals and a respective output control terminal, the second current conducting terminal of the first output transistor being coupled to the first current conducting terminal of the second output transistor, a first voltage source, and a second voltage source coupled to the second conducting terminal of the second output transistor, said amplifier comprising:

a sensing resistor coupled intermediate a sensing node and a reference potential, the positive supply being coupled to the sensing node in series with said sensing resistor;

a peak voltage detector including a comparator circuit having first and second comparator inputs and a comparator output, said first comparator input being coupled to the sensing node and said second comparator input being coupled to said comparator output, said comparator output further being coupled to a first summing node via a first divider resistor, said peak voltage detector further including a second divider resistor coupled intermediate the first summing node and the reference potential;

a coupling resistor coupled intermediate the sensing node and a second summing node;

reference means for providing a substantially constant reference voltage to a third summing node;

control amplifier circuit means for summing, averaging and amplifying the voltages present at the first, second and third summing nodes, the output of said control amplifier means being coupled to a primary control node;

a charge storage circuit including a resistor and a capacitor coupled in parallel, said charge storage circuit being coupled intermediate the first voltage source and the primary control node;

a current source circuit including a source resistor and a source transistor, said source transistor having first and second source terminals and a source control terminal, said source resistor being coupled intermediate the first voltage source and said first source terminal, said source control terminal being coupled to the primary control node; and a biasing circuit including a second current conducting element serially coupled to a bias resistor, the serial combination being coupled intermediate said second source terminal and the second voltage source, the first output control terminal being coupled to said second source terminal and the second output control terminal being coupled intermediate said bias resistor and said second current conducting element.

10. An improved push-pull amplifier of the type which includes first and second output transistors, each output transistor including first and second current conducting terminals and a respective output control terminal, the second current conducting terminal of the first output transistor being coupled to the first current conducting terminal of the second output transistor, the push-pull amplifier also including a first voltage source and a second voltage source, the second voltage source being coupled to the second conducting terminal of the second output transistor, said amplifier comprising:

resistor circuit sensing means for sensing the current supplied to the first output transistor by the first voltage source;

a charge storage circuit including a resistor and a capacitor coupled in parallel, said charge storage circuit being coupled intermediate the first voltage source and a primary control node;

circuit control means for selectively drawing current from the primary control node when the sensed current is below a predetermined minimum;

current source circuit means responsive to the charge stored in said charge storage circuit for supplying a control current, said current source circuit means including means for increasing the magnitude of the control current supplied when the charge stored in said charge storage means is increased and decreasing the magnitude of the control current when the charge stored in said charge storage circuit is decreased; and biasing circuit for biasing the first and second output transistors, said biasing circuit means being responsive to the magnitude of the control current to supply a voltage to the control terminals of the first and second output transistors.

11. An amplifier as recited in claim 10 wherein said circuit control means comprises a switching transistor having first and second switching terminals and a switching control terminal, a first current conducting element coupled intermediate said second switching terminal and a reference node, and a diode coupled to conduct current from the primary control node to said second switching terminal, said switching control terminal being coupled to said resistor circuit sensing means and said first switching terminal being coupled to the first voltage source.

12. An amplifier as recited in claim 10 wherein said circuit control means comprises amplifier means for controlling the voltage of the primary control node, said amplifier means being constructed to decrease the voltage of the primary control node if the difference between the average current supplied by the first voltage source and the average positive value of the output current is below a predetermined minimum.

13. An improved push-pull amplifier of the type which conducts a supply current through first and second output transistors, said amplifier comprising:
feedback circuit means for sensing the supply current;
memory means for storing a control signal;
control means responsive to said feedback circuit means for selectively altering the stored control signal;
source transistor means for providing an offset current which is proportional to the value of the control signal; and
bias circuit means for conducting the offset current to bias the first and second output transistors into the conducting range.

14. An amplifier as recited in claim 13 wherein said memory means comprises a capacitor.

15. An amplifier as recited in claim 14 wherein said control means comprises switching means responsive to said feedback means for selectively charging said capacitor.

16. An amplifier as recited in claim 15 wherein said switching means comprises means responsive to said feedback means for providing a charge signal when the supply current is below a predetermined minimum value, said switching means being responsive to the charge signal for charging said capacitor.

17. An amplifier as recited in claim 14 wherein said control means comprises amplifier means for controlling the charge stored by said capacitor, said amplifier means being constructed to increase the stored charge if the difference between the average current supplied by the first voltage source and the average positive value of the output current is below a predetermined minimum.

18. An amplifier as recited in claim 17 wherein said control means further comprises peak detector means for providing a voltage proportional to the average positive current of the output current.

19. An amplifier as recited in claim 18 wherein said control means comprises:
a peak voltage detector including a comparator circuit having first and second comparator inputs and a comparator output, said first comparator input being coupled to said feedback means and said second comparator input being coupled to said comparator output, said comparator output further being coupled to a first summing node via a first divider resistor, said peak voltage detector further including a second divider resistor coupled intermediate the first summing node and a reference potential;
a coupling resistor coupled intermediate said feedback means and a second summing node;
a control amplifier circuit having a first control amplifier input coupled to the first summing node, a second control amplifier input coupled to the second summing node and a control amplifier output, a capacitor coupled intermediate said control amplifier output and said control amplifier input, said control amplifier output being further coupled to said capacitor via a coupling resistor; and
reference means for providing a substantially constant reference voltage to the second summing node.

20. A method for automatically biasing a push-pull amplifier to maintain a predetermined parameter of the supply current above a predetermined minimum value, said method comprising the step of:
a. sensing the supply current and thereafter performing step b;
b. processing the sensed supply current to compute the value of the predetermined parameter and performing step c;
c. determining whether the value of the predetermined parameter of the supply current is below the predetermined minimum value and, if so, increasing the value of a control signal and, if not, performing step d; and
d. providing an offset current which is proportional to the value of the control signal such that the value of the predetermined parameter of the supply current will be above the predetermined minimum value and returning to step a.

21. The method as recited in claim 20 wherein step b, processing the sensed supply current to compute the value of the predetermined parameter, comprises the step of determining the average value of the supply current.

22. An amplifier as recited in claim 13 wherein said feedback circuit means further includes circuit means for measuring a predetermined parameter of the sensed supply current.

23. An amplifier as recited in claim 22 wherein said circuit means comprises means for determining the average value of the sensed supply current.

24. An amplifier as recited in claim 22 wherein said control means is responsive to said feedback circuit for altering the stored control signal it the measured predetermined parameter is below a predetermined minimum value, thereby to increase the predetermined parameter to the predetermined minimum value.

* * * * *